US010256261B2

(12) United States Patent
Kao et al.

(10) Patent No.: US 10,256,261 B2
(45) Date of Patent: Apr. 9, 2019

(54) FORMING METHOD OF VIA HOLE AND MANUFACTURING METHOD OF PIXEL STRUCTURE

(71) Applicant: Chunghwa Picture Tubes, LTD., Taoyuan (TW)

(72) Inventors: Chin-Tzu Kao, Changhua County (TW); Chien-Pang Tai, Taoyuan (TW); Pei-Nong Lu, Hsinchu County (TW)

(73) Assignee: Chunghwa Picture Tubes, LTD., Taoyuan (TW)

( * ) Notice: Subject to any disclaimer, the term of this patent is extended or adjusted under 35 U.S.C. 154(b) by 0 days.

(21) Appl. No.: 15/788,813

(22) Filed: Oct. 20, 2017

(65) Prior Publication Data

US 2019/0057987 A1  Feb. 21, 2019

(30) Foreign Application Priority Data

Aug. 21, 2017 (CN) .......................... 2017 1 0717486

(51) Int. Cl.
*H01L 27/12* (2006.01)
*H01L 21/311* (2006.01)

(52) U.S. Cl.
CPC .... *H01L 27/1288* (2013.01); *H01L 21/31116* (2013.01); *H01L 21/31144* (2013.01); *H01L 27/1255* (2013.01)

(58) Field of Classification Search
None
See application file for complete search history.

(56) References Cited

U.S. PATENT DOCUMENTS

| 8,785,939 B2* | 7/2014 | Park ....................... B82Y 10/00 257/59 |
| 2006/0022587 A1* | 2/2006 | Jeong .................. H01L 27/3246 313/504 |
| 2018/0061855 A1* | 3/2018 | Min ........................ H01L 21/50 |

FOREIGN PATENT DOCUMENTS

CN  1834790  9/2006

* cited by examiner

*Primary Examiner* — Bradley Smith
(74) *Attorney, Agent, or Firm* — JCIPRNET

(57) ABSTRACT

The invention provides a forming method of a via hole, including: sequentially stacking a patterned first conductive layer, a first insulating layer, a patterned second conductive layer, and a second insulating layer on a substrate. The second conductive layer and the first conductive layer overlap in a normal direction of the substrate, such that the second insulating layer has a protrusion portion protruding away from the substrate. A photosensitive material layer covers the second insulating layer. The photosensitive material layer is exposed, wherein a depth of exposure is equal to a vertical distance from a top surface of the protrusion portion to a surface of the photosensitive material layer. The exposed photosensitive material layer is removed by development to form a first via hole exposing the second insulating layer. The exposed second insulating layer is etched to form a second via hole to expose the second conductive layer, and then the photosensitive material layer is removed. A manufacturing method of a pixel structure, using the forming method of the via hole, is also provided.

4 Claims, 14 Drawing Sheets

FORMING METHOD OF VIA HOLE AND MANUFACTURING METHOD OF PIXEL STRUCTURE

CROSS-REFERENCE TO RELATED APPLICATION

This application claims the priority benefit of China application serial no. 201710717486.4, filed on Aug. 21, 2017. The entirety of the above-mentioned patent application is hereby incorporated by reference herein and made a part of this specification.

BACKGROUND OF THE INVENTION

Field of the Invention

The invention relates to a semiconductor technique and particularly relates to a forming method of a via hole and a manufacturing method of a pixel structure.

Description of Related Art

As the display technology improves, the size of pixel structure continues to decrease. To cope with the decrease of the size of the pixel structure, it is necessary to reduce the area of the non-translucent region as much as possible, so as to maintain the aperture ratio. One of the methods for reducing the area of the non-translucent region is to reduce the size of the via hole, which connects multiple layers in the pixel structure. In the past, for the positive photosensitive material layer, the size of the via hole mainly depends on the translucent portion of the mask, but there is a lack of a self-aligned mechanism between the layers. Besides, there is a limit in reducing the size of the via hole simply by reducing the size of the translucent portion of the mask. Therefore, there is a need for a technical solution that can solve such problems.

SUMMARY OF THE INVENTION

The invention is directed to a forming method of a via hole for limiting the size of the via hole.

The invention is further directed to a manufacturing method of a pixel structure for connecting multiple layers through self alignment.

The invention provides a forming method of a via hole, including: sequentially stacking a first conductive layer that is patterned, a first insulating layer, a second conductive layer that is patterned, and a second insulating layer on a substrate, wherein the second conductive layer and the first conductive layer overlap in a normal direction of the substrate, such that the second insulating layer includes a protrusion portion protruding away from the substrate; disposing a photosensitive material layer to cover the second insulating layer; exposing the photosensitive material layer, wherein a depth of the exposing is equal to a vertical distance from a top surface of the protrusion portion to a surface of the photosensitive material layer; removing the photosensitive material layer that has been exposed by development to form a first via hole that exposes the second insulating layer; etching the second insulating layer that has been exposed to form a second via hole to expose the second conductive layer; and then removing the photosensitive material layer.

According to an embodiment of the invention, the forming method of the via hole further includes: exposing with a mask, wherein a translucent portion of the mask has a first width and the top surface of the protrusion portion has a second width, and the first width is smaller than the second width.

According to an embodiment of the invention, the forming method of the via hole further includes: exposing with a mask, wherein a translucent portion of the mask has a first width and the top surface of the protrusion portion has a second width, and the first width is greater than or equal to the second width.

According to an embodiment of the invention, in the forming method of the via hole, the translucent portion of the mask is located right above the first conductive layer.

The invention provides a forming method of a via hole, including: forming a photosensitive material layer on a substrate; exposing the photosensitive material layer; removing the photosensitive material layer that has been exposed by development to form a first via hole; and performing plasma etching on the first via hole. Moreover, an exposure dose of the exposing is 50% to 90% when an exposure dose sufficient to completely remove the photosensitive material layer that has been exposed in the development is set as 100%.

According to an embodiment of the invention, in the forming method of the via hole, the plasma etching includes oxygen plasma etching.

The invention provides a manufacturing method of a pixel structure, including: forming a gate and a conductive bump on a substrate; forming a first insulating layer on the substrate to cover the gate and the conductive bump; forming a channel layer on the first insulating layer above the gate; forming a source and a drain at two ends of the channel layer, wherein the drain extends from the channel layer onto the first insulating layer above the conductive bump; forming a second insulating layer on the first insulating layer to cover the source and the drain; forming a photosensitive material layer on the second insulating layer; exposing the photosensitive material layer above the conductive bump, wherein a depth of the exposing is equal to a vertical distance from a top surface of the second insulating layer to a surface of the photosensitive material layer; removing the photosensitive material layer that has been exposed by development to form a first via hole that exposes the second insulating layer; etching the second insulating layer that has been exposed to form a second via hole to expose the drain; removing the photosensitive material layer; and forming a pixel electrode on the second insulating layer, wherein the pixel electrode is electrically connected with the drain via the second via hole.

According to an embodiment of the invention, in the manufacturing method of the pixel structure, the gate and the conductive bump are formed by different processes.

According to an embodiment of the invention, in the manufacturing method of the pixel structure, the gate and the conductive bump are formed by the same process.

According to an embodiment of the invention, the manufacturing method of the pixel structure further includes: exposing with a mask, wherein a translucent portion of the mask has a first width and the top surface of the second insulating layer has a second width, and the first width is smaller than the second width.

According to an embodiment of the invention, the manufacturing method of the pixel structure further includes: exposing with a mask, wherein a translucent portion of the mask has a first width and the top surface of the second insulating layer has a second width, and the first width is greater than or equal to the second width.

According to an embodiment of the invention, in the manufacturing method of the pixel structure, the translucent portion of the mask is located right above the conductive bump.

The invention provides a manufacturing method of a pixel structure, including: forming a gate on a substrate; forming a first insulating layer on the substrate to cover the gate; forming a channel layer on the first insulating layer above the gate; forming a source and a drain at two ends of the channel layer; forming a second insulating layer on the first insulating layer to cover the source and the drain; forming a photosensitive material layer on the second insulating layer; exposing the photosensitive material layer above the drain, wherein a depth of the exposing is equal to a vertical distance from a top surface of the second insulating layer to a surface of the photosensitive material layer; removing the photosensitive material layer that has been exposed by development to form a first via hole that exposes the second insulating layer; performing plasma etching on the first via hole; etching the second insulating layer that has been exposed to form a second via hole to expose the drain; removing the photosensitive material layer; and forming a pixel electrode on the second insulating layer, wherein the pixel electrode is electrically connected with the drain via the second via hole. Moreover, an exposure dose of the exposing is 50% to 90% when an exposure dose sufficient to completely remove the photosensitive material layer that has been exposed in the development is set as 100%.

Based on the above, in the forming method of the via hole according to an embodiment of the invention, due to the patterned first conductive layer, the second insulating layer has the protrusion portion that protrudes away from the substrate, which is combined with the design of the size of the translucent portion of the mask to limit the subsequently formed via hole to the position above the first conductive layer. Particularly, in the forming method of the via hole according to an embodiment of the invention, the via hole is automatically aligned with the second conductive layer. Moreover, in the forming method of the via hole according to an embodiment of the invention, the size of the via hole is adjustable by plasma etching and is not limited by the translucent portion of the mask.

DESCRIPTION OF THE EMBODIMENTS

Figure 1A:
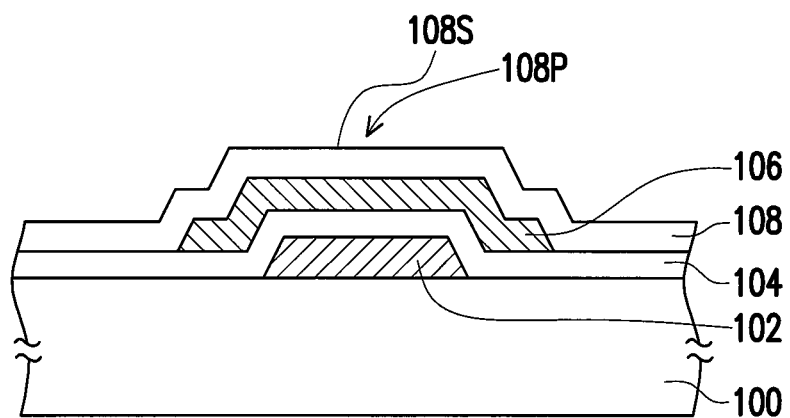
FIG. 1A to FIG. 1F are schematic cross-sectional views showing a forming method of a via hole according to the first embodiment of the invention.

First, referring to FIG. 1A, a substrate 100 is provided. The material of the substrate 100 may be glass, quartz, an organic polymer, an opaque/reflective material (e.g., a conductive material, metal, wafer, and ceramics), or other suitable materials. A patterned first conductive layer 102, a first insulating layer 104, a patterned second conductive layer 106, and a second insulating layer 108 are stacked sequentially on the substrate 100. The second conductive layer 106 and the first conductive layer 102 overlap in a normal direction of the substrate 100. More specifically, in the normal direction of the substrate 100, an orthographic projection of the first conductive layer 102 is located within an orthographic projection of the second conductive layer 106. In this case, the size of the first conductive layer 102 (e.g., the area of the orthographic projection) becomes one of the factors that limit the size of the via hole formed subsequently. Moreover, the first conductive layer 102 that is thicker facilitates subsequent formation of the via hole. In this embodiment, because the second conductive layer 106 and the first conductive layer 102 overlap in the normal direction of the substrate 100, the second insulating layer 108 has a protrusion portion 108P that protrudes away from the substrate 100. The protrusion portion 108P has a top surface 108S, and the top surface 108S has a second width W2 (as shown in FIG. 1C). The material of the first conductive layer 102 (or the second conductive layer 106) may be a metal material, but not limited thereto. In other embodiments, the material of the first conductive layer 102 (or the second conductive layer 106) may also be other conductive materials (e.g., an alloy, a nitride of the metal material, an oxide of the metal material, a nitrogen oxide of the metal material, or a stack layer of the metal material and other conductive materials). The material of the first insulating layer 104 (or the second insulating layer 108) may be an inorganic material (e.g., silicon oxide, silicon nitride, silicon oxynitride, or a stack layer of at least two of the foregoing), an organic material, or a combination of the foregoing. In addition, a method of patterning the first conductive layer 102 (or the second conductive layer 106) is the commonly-known photolithography technique or other methods for patterning the first conductive layer 102 (or the second conductive layer 106). Thus, details thereof are not repeated hereinafter.

Figure 1B:
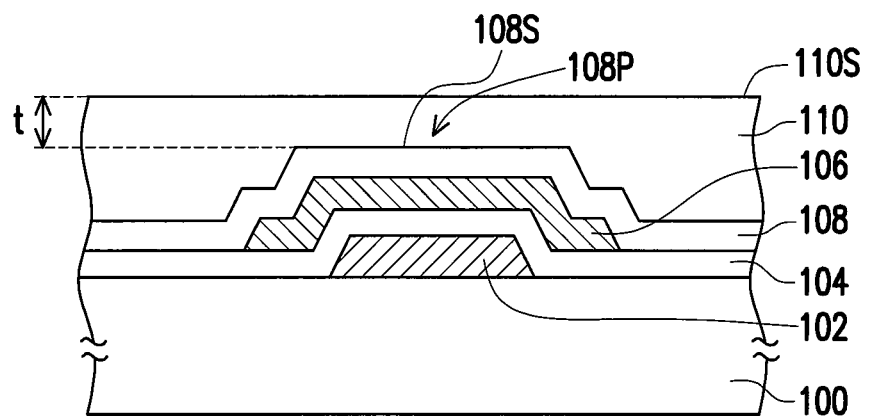
Figure 1C:
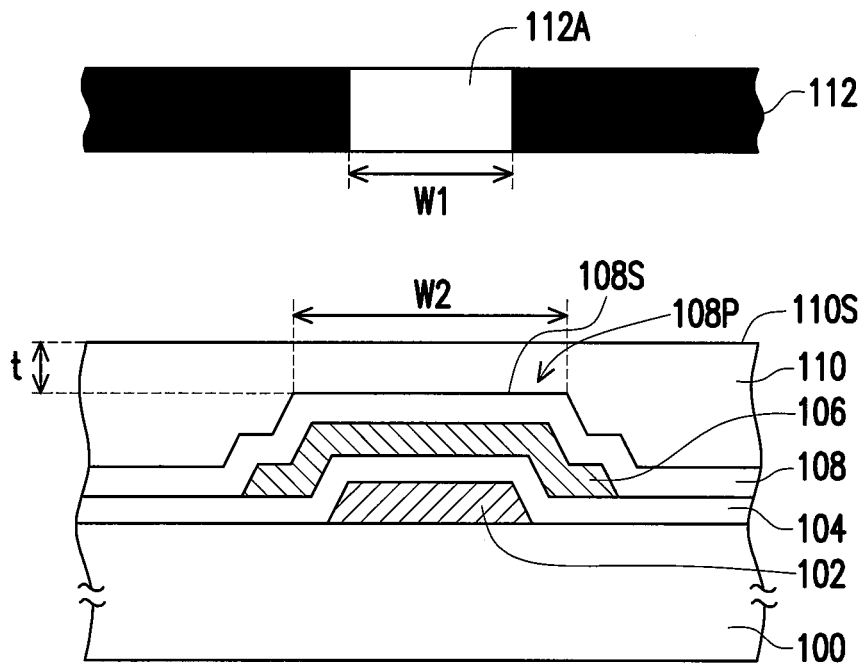

Referring to FIG. 1B, a photosensitive material layer 110 is disposed to cover the second insulating layer 108, and the photosensitive material layer 110 has a flat surface 110S. In this embodiment, the thickness of the photosensitive material layer 110 above the first conductive layer 102 (i.e., a vertical distance t from the top surface 108S of the protrusion portion 108P to the surface 110S of the photosensitive material layer 110) is smaller than the thickness of the photosensitive material layer 110 that is not above the first conductive layer 102. Therefore, in the subsequent exposure process, the photosensitive material layer 110 above the first conductive layer 102 may be exposed by using a smaller exposure dose or shorter exposure time.

Referring to FIG. 1C, the photosensitive material layer 110 is exposed via a translucent portion 112A of a mask 112 by using ultraviolet light, for example. The translucent portion 112A may be located right above the first conductive layer 102, so as to expose the photosensitive material layer 110 above the first conductive layer 102, and a depth of exposure is equal to the vertical distance t from the top surface 108S of the protrusion portion 108P to the surface 110S of the photosensitive material layer 110. The translucent portion 112A of the mask 112 has a first width W1. In this embodiment, the first width W1 of the translucent portion 112A may be smaller than the second width W2 of the top surface 108S of the protrusion portion 108P. Thus, the first width W1 of the translucent portion 112A becomes the decisive factor that limits the size of the via hole formed subsequently. However, in other embodiments, the first width W1 of the translucent portion 112A may be greater than or equal to the second width W2 of the top surface 108S of the protrusion portion 108P. In that case, the decisive factor that limits the size of the via hole formed subsequently is the size of the first conductive layer 102 (e.g., the area of the orthographic projection).

Figure 1D:
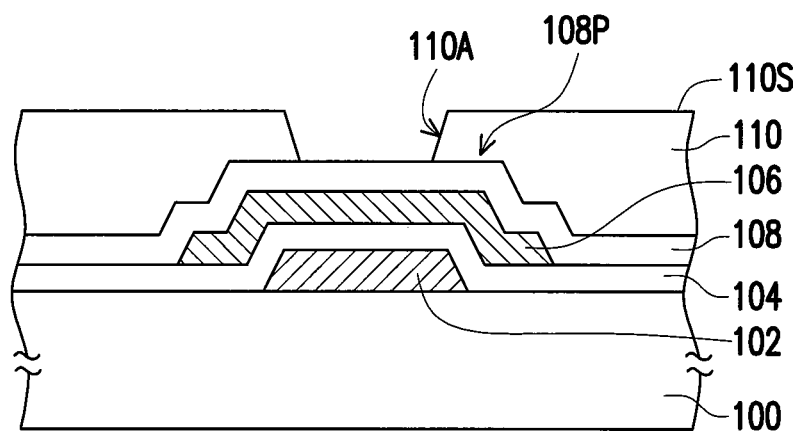

Referring to FIG. 1D, the exposed photosensitive material layer (not shown) is removed by development to form a first via hole 110A that exposes the second insulating layer 108 in the photosensitive material layer 110.

Figure 1E:
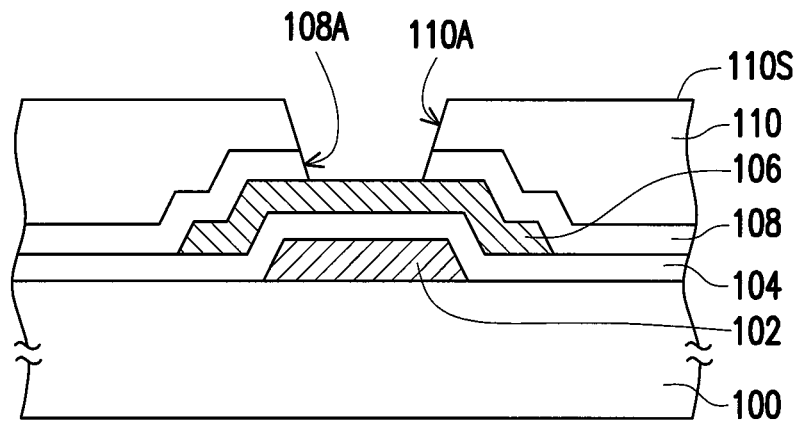

Referring to FIG. 1E, the exposed second insulating layer (not shown) is etched to form a second via hole 108A in the second insulating layer 108, and the second via hole 108A exposes the second conductive layer 106. A sidewall of the second via hole 108A and a sidewall of the first via hole 110A form a continuous plane. The method of etching is not particularly limited, which may be dry etching or wet etching.

Figure 1F:
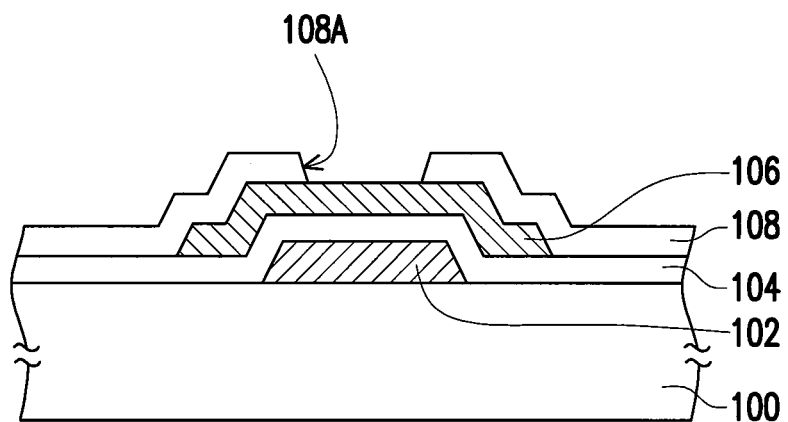

Referring to FIG. 1F, the photosensitive material layer 110 is removed to complete formation of the via hole (e.g., the second via hole 108A). In this embodiment, the size of the second via hole 108A and the size of the translucent portion 112A of the mask 112 are substantially equal, and the size of the second via hole 108A in the normal direction of the substrate 100 is smaller than the size of the first conductive layer 102. In other words, according to the forming method of the via hole in the first embodiment of the invention, when observed in the normal direction of the substrate 100, the second via hole 108A is limited within the range of the first conductive layer 102, which may be used together with the translucent portion 112A of the mask 112 to adjust the size of the second via hole 108A.

FIG. 2A to FIG. 2D are schematic cross-sectional views showing a forming method of a via hole according to the second embodiment of the invention.

Figure 2A:
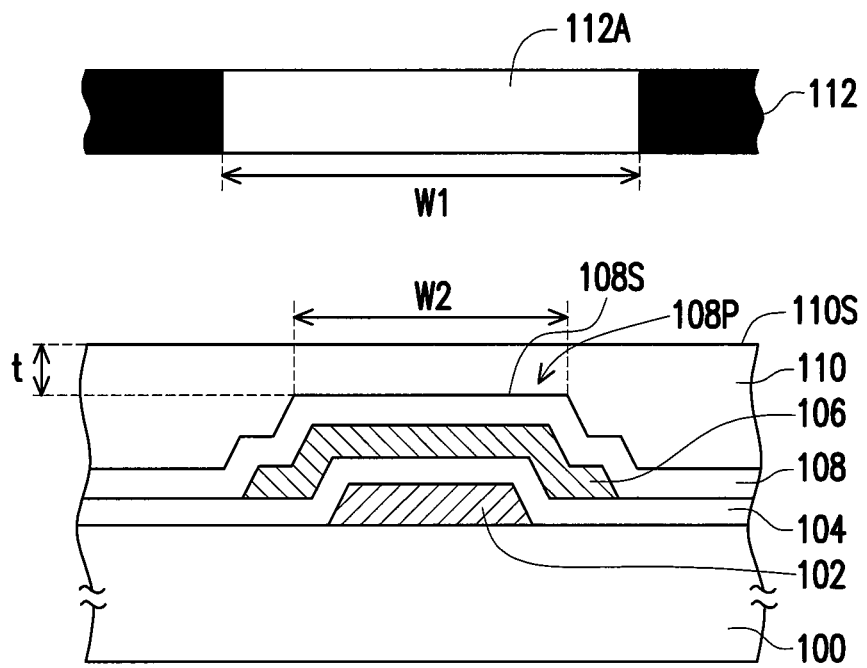
FIG. 2A to FIG. 2D are schematic cross-sectional views showing a forming method of a via hole according to the second embodiment of the invention.

In the forming method of the via hole according to the second embodiment of the invention, the steps of FIG. 1A to FIG. 1B described above are performed first. Then, as shown in FIG. 2A, the photosensitive material layer 110 is exposed via the translucent portion 112A of the mask 112 by using ultraviolet light, for example. The translucent portion 112A may be located right above the first conductive layer 102, so as to expose the photosensitive material layer 110 above the first conductive layer 102, and the depth of exposure is equal to the vertical distance t from the top surface 108S of the protrusion portion 108P to the surface 110S of the photosensitive material layer 110. The translucent portion 112A of the mask 112 has the first width W1. In this embodiment, the first width W1 of the translucent portion 112A may be greater than or equal to the second width W2 of the top surface 108S of the protrusion portion 108P. Therefore, the decisive factor that limits the size of the via hole formed subsequently is the size of the first conductive layer 102 (e.g., the area of the orthographic projection).

Figure 2B:
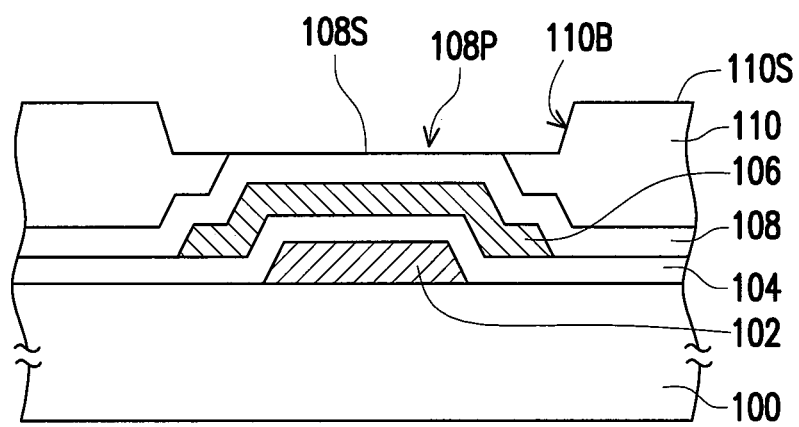

Referring to FIG. 2B, the exposed photosensitive material layer (not shown) is removed by development to form the first via hole 110B that exposes the second insulating layer 108 in the photosensitive material layer 110. The exposed photosensitive material layer (not shown) includes the photosensitive material layer located above the first conductive layer 102 and a portion of the photosensitive material layer that is not located above the first conductive layer 102. Therefore, a bottom surface of the first via hole 110B may be formed by both the second insulating layer 108 (e.g., the top surface 108S of the protrusion portion 108P) and the photosensitive material layer 110.

Figure 2C:
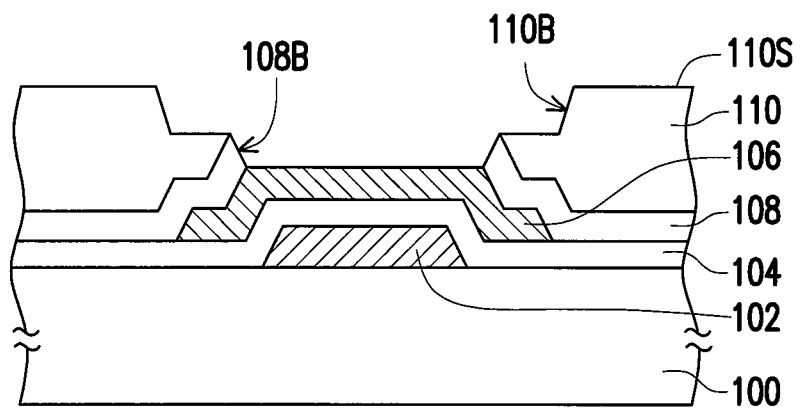

Referring to FIG. 2C, the exposed second insulating layer (not shown) is etched to form the second via hole 108B that exposes the second conductive layer 106 in the second insulating layer 108. The size of the second via hole 108B is equal to the size of the exposed second conductive layer 106, and the second via hole 108B is self-aligned with the second conductive layer 106. More specifically, the second insulating layer 108 on the bottom surface of the first via hole 110B may be etched until the second conductive layer 106 is exposed. In this embodiment, the size of the second conductive layer 106 and the size of the first conductive layer 102 are substantially equal. In other words, in the forming method of the via hole according to the second embodiment of the invention, the size and position of the second via hole 108B are determined by the size and position of the first conductive layer 102. The method of etching is not particularly limited, which may be dry etching or wet etching.

Figure 2D:
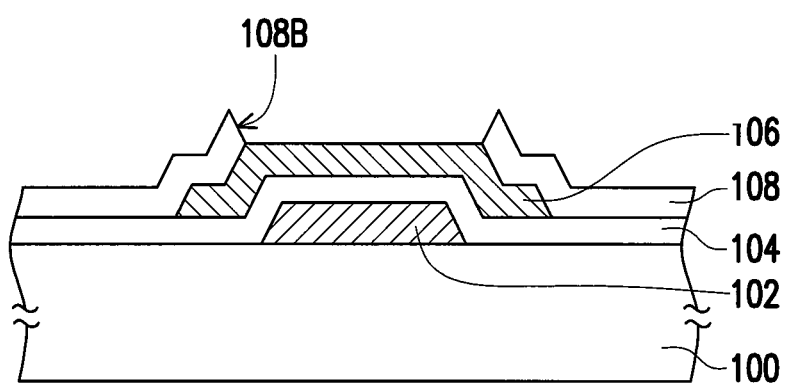

Referring to FIG. 2D, the photosensitive material layer 110 is removed to complete formation of the via hole (e.g., the second via hole 108B).

FIG. 3A to FIG. 3G are schematic cross-sectional views showing a manufacturing method of a pixel structure according to the first embodiment of the invention. In this embodiment, the forming method of the via hole according to the second embodiment of the invention is applied. Thus, unless otherwise specified, this embodiment is described with reference to the forming method of the via hole according to the second embodiment above.

Figure 3A:
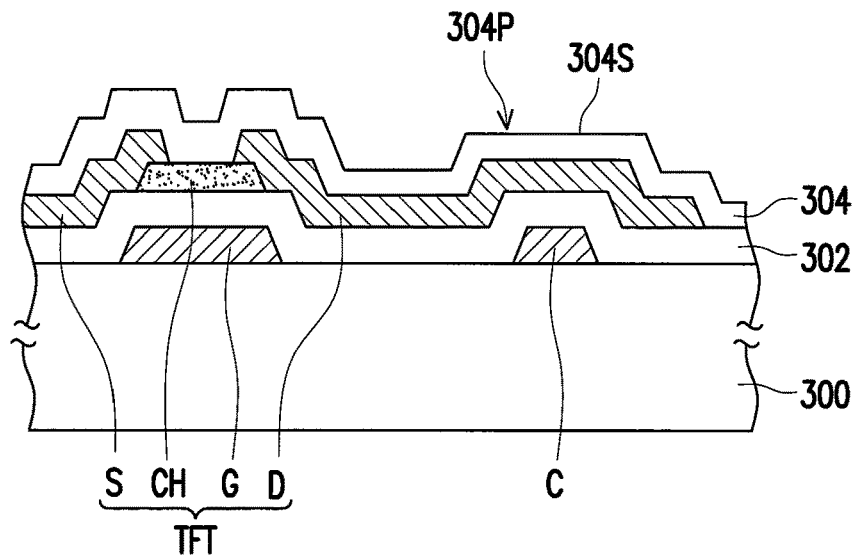
FIG. 3A to FIG. 3G are schematic cross-sectional views showing a manufacturing method of a pixel structure according to the first embodiment of the invention.

Referring to FIG. 3A, a substrate 300 is provided. Regarding the material of the substrate 300, please refer to the description of the substrate 100. A first conductive layer (not shown) is formed on the substrate 300. The first conductive layer is patterned to form a gate G and a conductive bump C. In other words, the gate G and the conductive bump C may be formed by the same process. However, the invention is not limited thereto. In other embodiments, the gate G and the conductive bump C may be formed by different processes. Therefore, the thickness of the conductive bump C and the thickness of the gate G may be different. For example, the thickness of the conductive bump C may be greater than the thickness of the gate G, and the thicker conductive bump C facilitates subsequent formation of the via hole. Next, a first insulating layer 302 is formed on the substrate 300 to cover the gate G and the conductive bump C. A method of forming the first insulating layer 302 is not particularly limited. For example, the first insulating layer 302 may be deposited all over the substrate 300 by physical vapor deposition or chemical vapor deposition. The first insulating layer 302 may serve as a gate insulating layer. A channel layer CH is formed on the first insulating layer 302 above the gate G. The channel layer CH partially overlaps the gate G in the normal direction of the substrate 300. In this embodiment, in the normal direction of the substrate 300, an orthographic projection of the channel CH is located within an orthographic projection of the gate G. The material of the channel layer CH may be a semiconductor layer (e.g., amorphous silicon, polycrystalline silicon, microcrystalline silicon, and single crystal silicon), an oxide semiconductor material (e.g., IGZO), an organic semiconductor material, other suitable semiconductor materials, or a stack of other suitable materials and the foregoing materials. A source S and a drain D are formed at two ends of the channel layer CH. Then, an active device TFT is preliminarily completed. In this embodiment, the drain D extends from one end of the channel layer CH onto the first insulating layer 302 above the conductive bump C and covers the conductive bump C.

Generally, a metal material is used as the gate G, the conductive bump C, the source S, and the drain D. However, the invention is not limited thereto. The gate G, the conductive bump C, the source S, and the drain D may be formed by using conductive materials other than metal, e.g., an alloy, a nitride of the metal material, an oxide of the metal material, a nitrogen oxide of the metal material, or a stack layer of the metal material and other conductive materials. A second insulating layer 304 is formed on the first insulating layer 302 to cover the source S and the drain D. In this embodiment, the second insulating layer 304 above the conductive bump C has a protrusion portion 304P that protrudes away from the substrate 300. The protrusion portion 304P has a top surface 304S, and the top surface 304S has a second width W2 (as shown in FIG. 3C). The material of the first insulating layer 302 and the second insulating layer 304 includes an inorganic material (e.g., silicon oxide, silicon nitride, silicon oxynitride, other suitable materials, or a stack layer of at least two of the foregoing), an organic material, other suitable materials, or a combination of the foregoing.

Figure 3B:
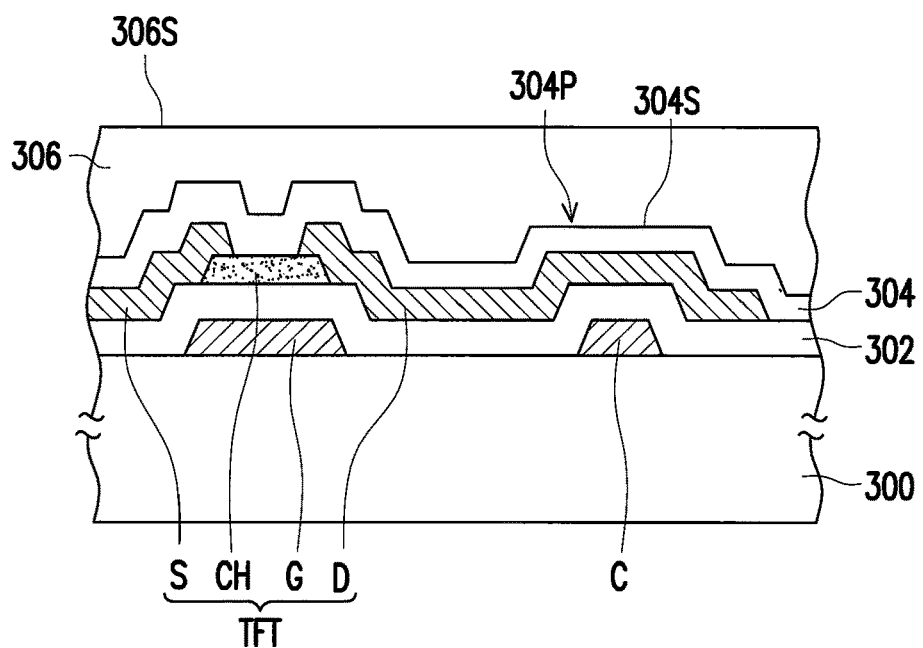
Figure 3C:
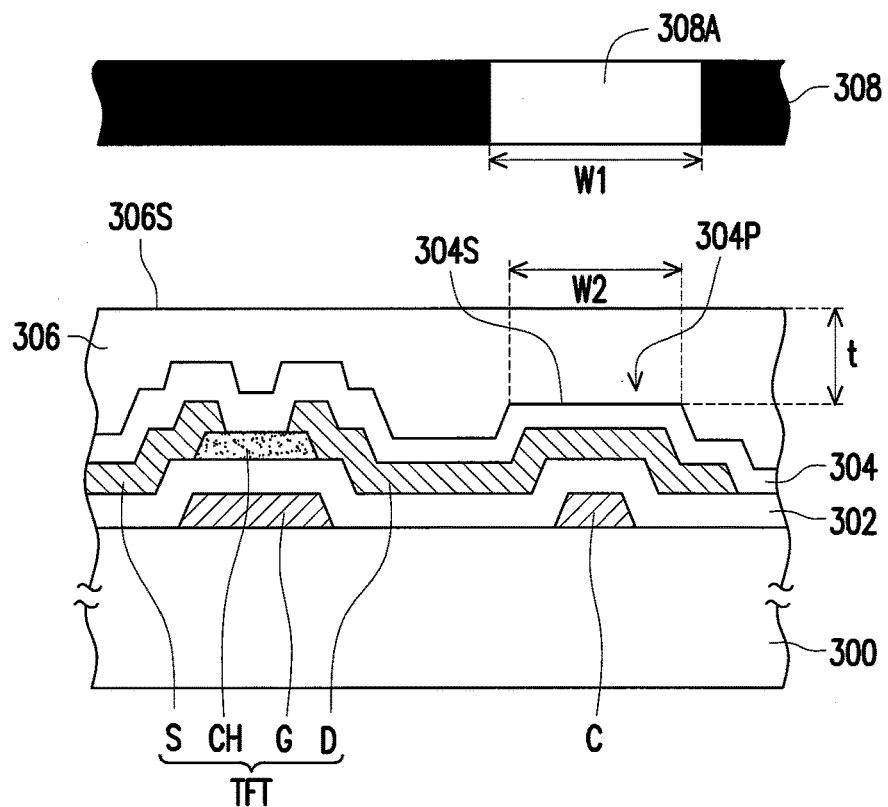

Referring to FIG. 3B, a photosensitive material layer 306 is formed on the second insulating layer 304, and the photosensitive material layer 306 has a flat surface 306S.

Referring to FIG. 3C, the photosensitive material layer 306 is exposed via a translucent portion 308A of a mask 308 by using ultraviolet light, for example. The translucent portion 308A may be located right above the conductive bump C, so as to expose the photosensitive material layer 306 above the conductive bump C, and a depth of exposure is equal to a vertical distance t from the top surface 304S of the protrusion portion 304P to the surface 306S of the photosensitive material layer 306. The translucent portion 308A of the mask 308 has a first width W1. In this embodiment, the first width W1 of the translucent portion 308A is greater than or equal to the second width W2 of the top surface 304S of the protrusion portion 304P. Therefore, the decisive factor that limits the size of the via hole formed subsequently is the size of the conductive bump C (e.g., the area of the orthographic projection).

Figure 3D:
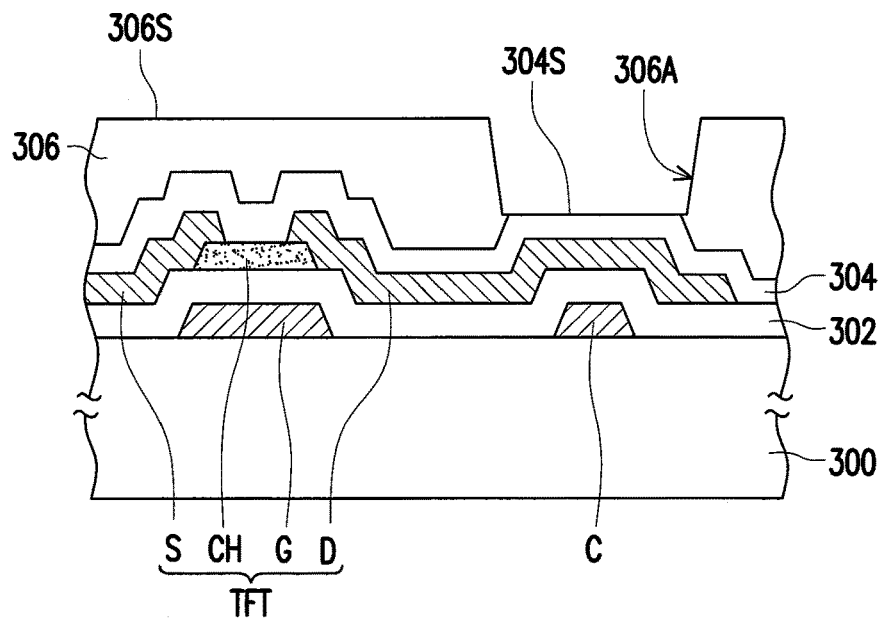

Referring to FIG. 3D, the exposed photosensitive material layer (not shown) is removed by development to form a first via hole 306A that exposes the second insulating layer 304 in the photosensitive material layer 306.

Figure 3E:
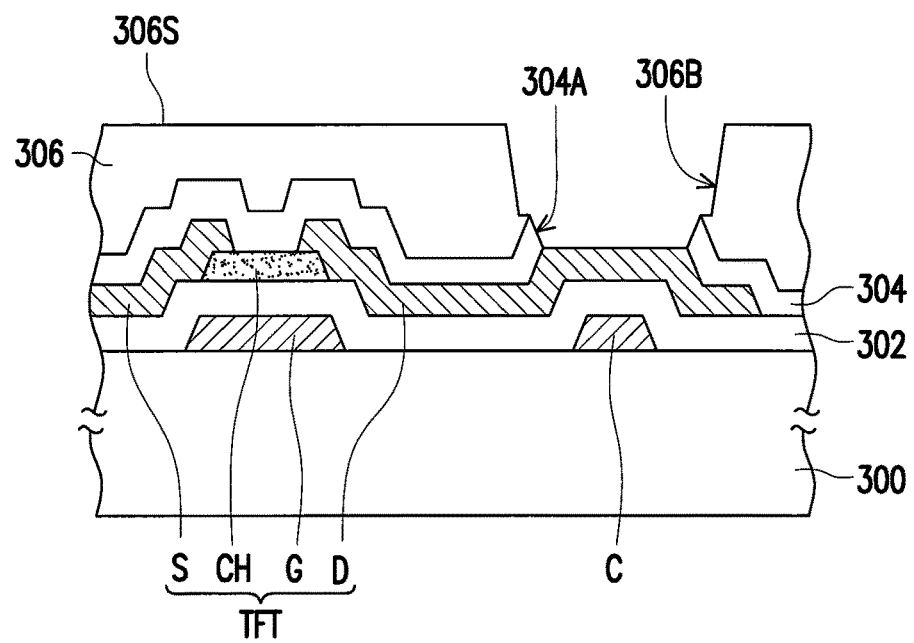

Referring to FIG. 3E, the exposed second insulating layer (not shown) is etched to form a second via hole 304A that exposes the drain D in the second insulating layer 304. The size of the second via hole 304A is equal to the size of the exposed drain D, and the second via hole 304A is self-aligned with the drain D. Moreover, the size of the exposed drain D and the size of the conductive bump C are substantially equal. In other words, the size of the second via hole 304A may be defined by the size of the conductive bump C.

Figure 3F:
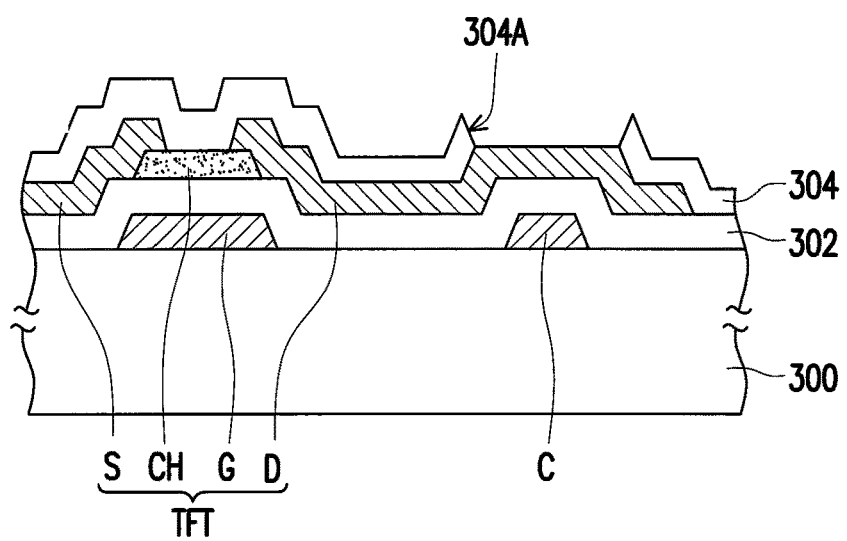

Referring to FIG. 3F, the photosensitive material layer 306 is removed to complete formation of the via hole (e.g., the second via hole 304A).

Figure 3G:
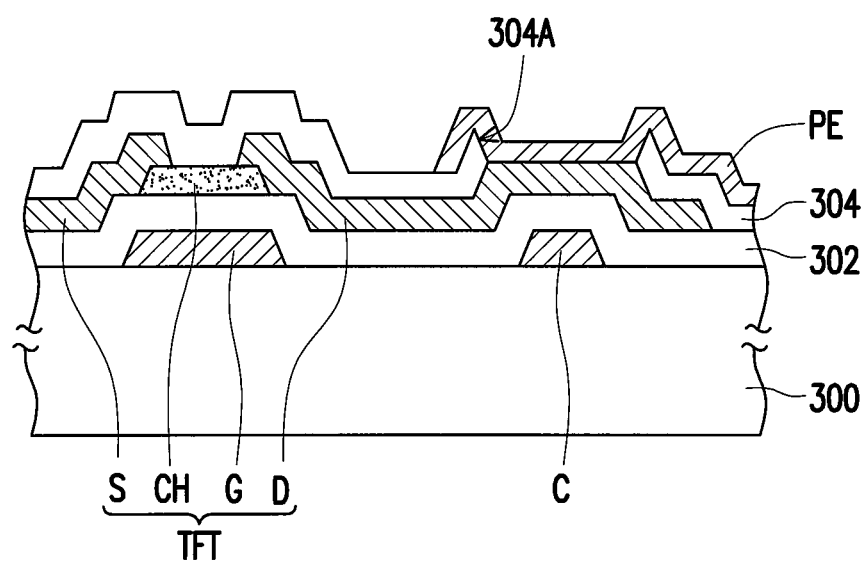

Referring to FIG. 3G, A pixel electrode PE is formed on the second insulating layer 304, and the pixel electrode PE is electrically connected with the drain D via the second via hole 304A. The pixel electrode PE may be a transmissive pixel electrode, a reflective pixel electrode, or a transflective pixel electrode. The material of the transmissive pixel electrode includes a metal oxide, e.g., indium tin oxide, indium zinc oxide, aluminum tin oxide, aluminum zinc oxide, indium germanium zinc oxide, other suitable oxides, or a stack layer of at least two of the foregoing. The material of the reflective pixel electrode includes a metal material having high reflectivity.

Figure 4A:
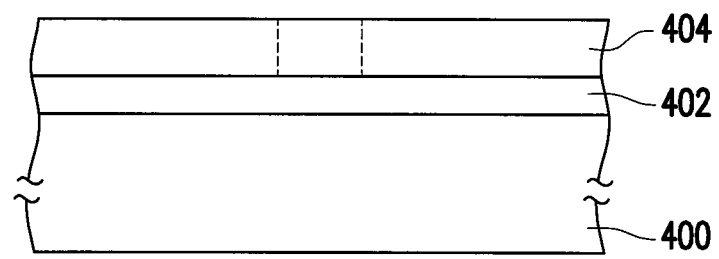
FIG. 4A to FIG. 4C are schematic cross-sectional views showing a forming method of a via hole according to the third embodiment of the invention.
Figure 4B:
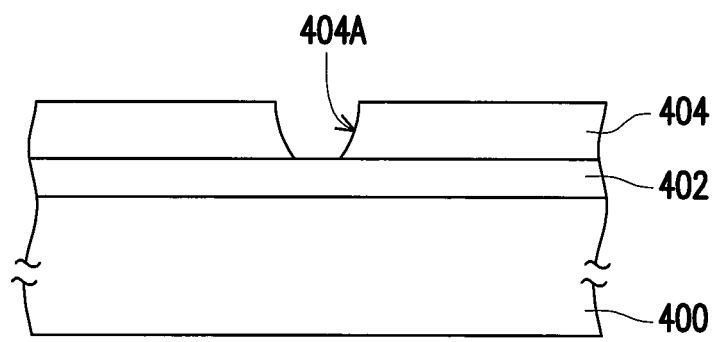
Figure 4C:
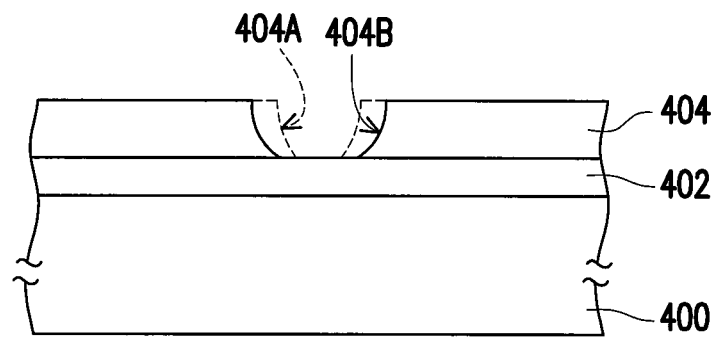

FIG. 4A to FIG. 4C are schematic cross-sectional views showing a forming method of a via hole according to the third embodiment of the invention.

Referring to FIG. 4A, a substrate 400 is provided. Regarding the material of the substrate 400, please refer to the description of the substrate 100. A photosensitive material layer 404 is formed on the substrate 400. However, the invention is not limited thereto, and an additional layer may be formed between the substrate 400 and the photosensitive material layer 404. For example, an insulating layer 402 may be formed on the substrate 400 first, and then the photosensitive material layer 404 is formed thereon. Next, the photosensitive material layer 404 is exposed via a translucent portion 406A of a mask 406 by using ultraviolet light, for example. In this embodiment, an exposure dose of the exposure may be 50% to 90% when an exposure dose sufficient to completely remove the exposed photosensitive material layer in the development is set as 100%.

Referring to FIG. 4B, the exposed photosensitive material layer (not shown) is removed by development to form a first via hole 404A that exposes the insulating layer 402 in the photosensitive material layer 404.

Please refer to FIG. 4C, plasma etching is performed on the first via hole 404A to form a second via hole 404B. The size of the second via hole 404B is greater than the size of the first via hole 404A. In other words, according to the forming method of the via hole in the third embodiment of the invention, the size of the via hole (e.g., the second via hole 404B) is adjustable by plasma etching. The plasma etching may include oxygen plasma etching, but not limited thereto.

FIG. 5A to FIG. 5F are schematic cross-sectional views showing a manufacturing method of a pixel structure according to the second embodiment of the invention.

In the manufacturing method of the pixel structure according to the second embodiment of the invention, steps of FIG. 3A to FIG. 3B are performed first, but the step of forming the conductive bump C on the substrate 300 is omitted. Moreover, in the manufacturing method of the pixel structure according to the second embodiment of the invention, the forming method of the via hole according to the third embodiment of the invention is applied. Thus, unless otherwise specified, this embodiment is described with reference to the forming method of the via hole according to the third embodiment above.

Figure 5A:
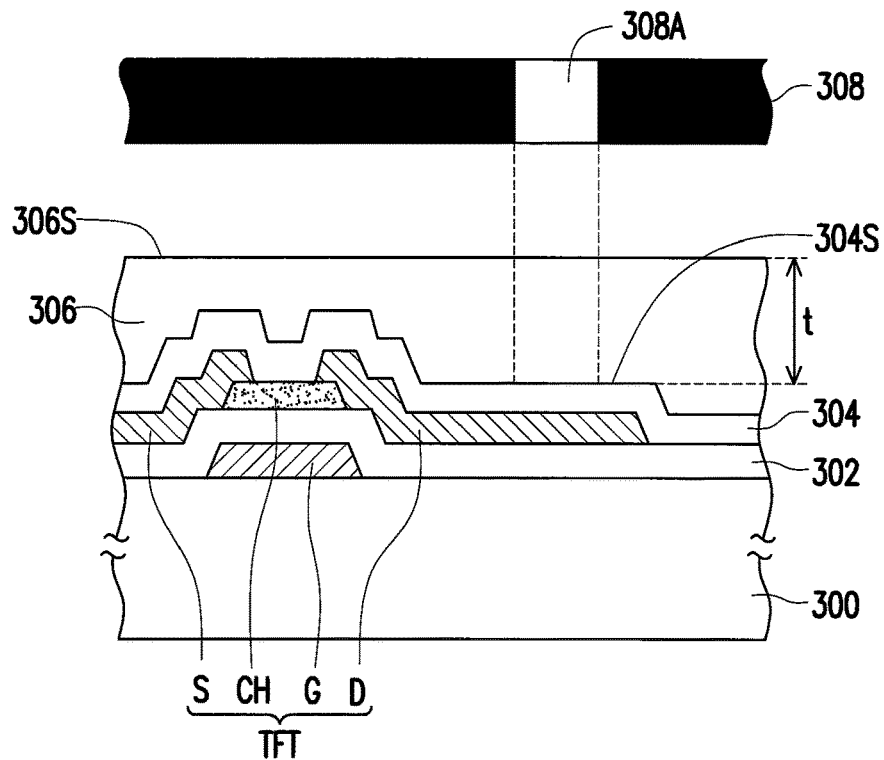
FIG. 5A to FIG. 5F are schematic cross-sectional views showing a manufacturing method of a pixel structure according to the second embodiment of the invention.

Referring to FIG. 5A, the photosensitive material layer 306 is exposed via the translucent portion 308A of the mask 308 by using ultraviolet light, for example, and a depth of exposure is equal to a vertical distance t from the top surface 304S of the second insulating layer 304 to the surface 306S of the photosensitive material layer 306. In this embodiment, an exposure dose of the exposure may be 50% to 90% when an exposure dose sufficient to completely remove the exposed photosensitive material layer in the development is set as 100%.

Figure 5B:
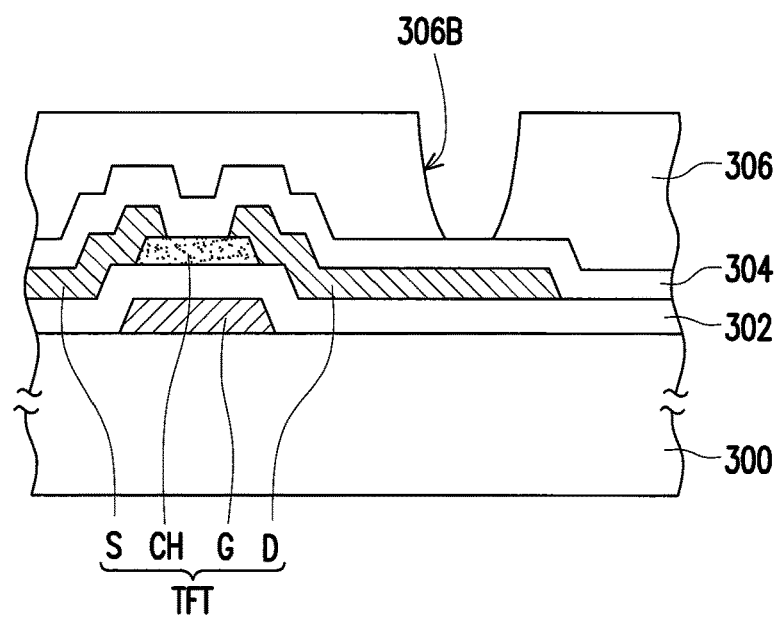

Referring to FIG. 5B, the exposed photosensitive material layer (not shown) is removed by development to form the first via hole 306B that exposes the second insulating layer 304 in the photosensitive material layer 306.

Figure 5C:
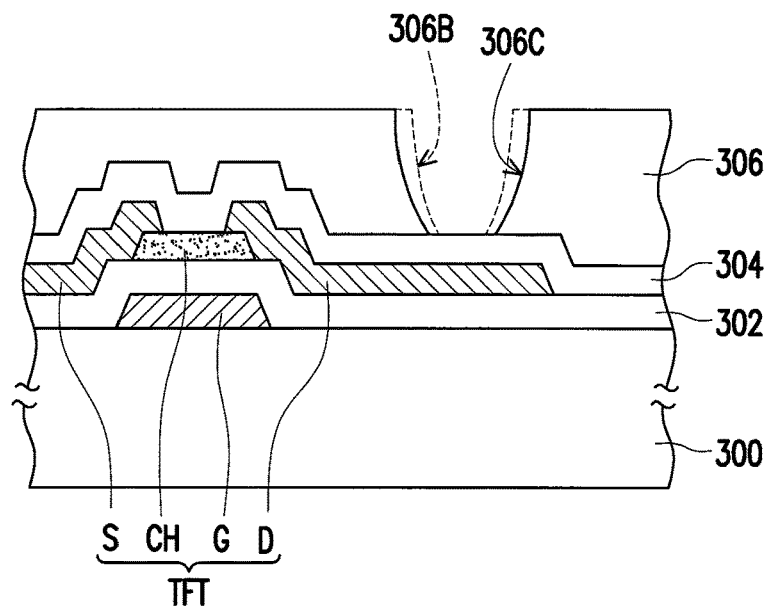

Referring to FIG. 5C, plasma etching is performed on the first via hole 306B to form a second via hole 306C. The size of the second via hole 306C is greater than the size of the first via hole 306B.

Figure 5D:
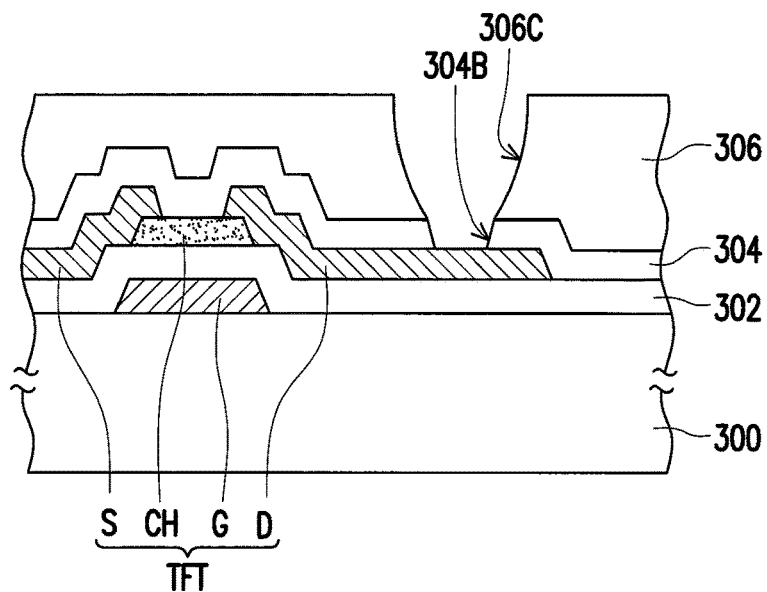

Referring to FIG. 5D, the exposed second insulating layer (not shown) is etched to form a third via hole 304B that exposes the drain D in the second insulating layer 304. The size of the third via hole 304B is determined by the second via hole 306C formed by plasma etching. Therefore, an aperture of the third via hole 304B may be smaller. The method of etching the second insulating layer 304 is not particularly limited, which may be dry etching or wet etching.

Figure 5E:
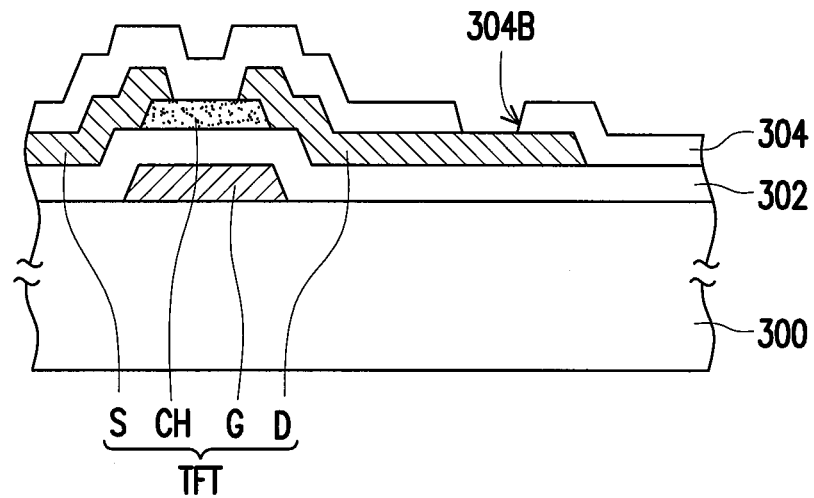

Referring to FIG. 5E, the photosensitive material layer 306 is removed to complete formation of the via hole (e.g., the third via hole 304B).

Figure 5F:
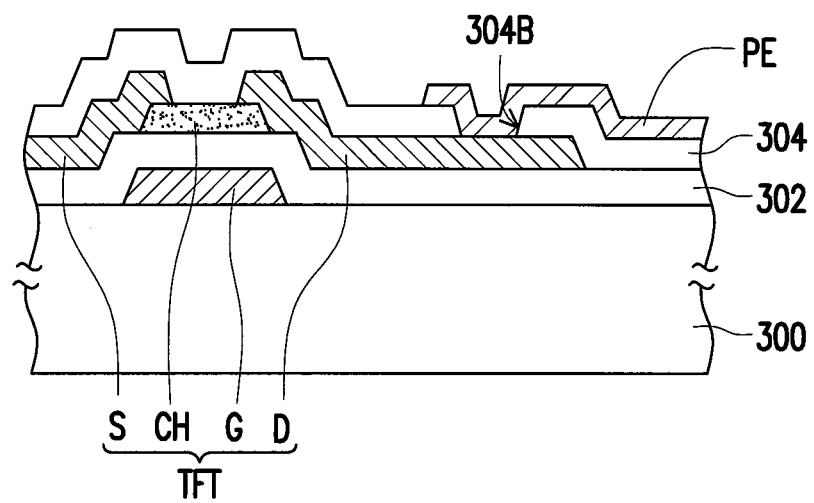

Referring to FIG. 5F, the pixel electrode PE is formed on the second insulating layer 304, and the pixel electrode PE is filled into the third via hole 304B to be electrically connected with the drain D. Regarding the type of the pixel electrode PE, please refer to the above embodiments.

Based on the above, in the forming method of the via hole according to an embodiment of the invention, due to the patterned first conductive layer, the second insulating layer has the protrusion portion that protrudes away from the substrate, which is combined with the design of the size of the translucent portion of the mask to limit the subsequently formed via hole to the position above the first conductive layer. Particularly, in the forming method of the via hole according to an embodiment of the invention, the via hole is self-aligned with the second conductive layer. Moreover, in the forming method of the via hole according to an embodiment of the invention, the plasma etching helps to form the via hole with a small aperture.

What is claimed is:

1. A manufacturing method of a pixel structure, comprising:
    forming a gate and a conductive bump on a substrate;
    forming a first insulating layer on the substrate to cover the gate and the conductive bump;
    forming a channel layer on the first insulating layer above the gate;
    forming a source and a drain at two ends of the channel layer, wherein the drain extends from the channel layer onto the first insulating layer above the conductive bump;
    forming a second insulating layer on the first insulating layer to cover the source and the drain;
    forming a photosensitive material layer on the second insulating layer;
    exposing the photosensitive material layer above the conductive bump, wherein a depth of the exposing is equal to a vertical distance from a top surface of the second insulating layer to a surface of the photosensitive material layer;
    removing the photosensitive material layer that has been exposed by development to form a first via hole that exposes the second insulating layer;
    etching the second insulating layer that has been exposed to form a second via hole to expose the drain;
    removing the photosensitive material layer; and
    forming a pixel electrode on the second insulating layer, wherein the pixel electrode is electrically connected with the drain via the second via hole.

2. The manufacturing method of the pixel structure according to claim 1, wherein the gate and the conductive bump are formed by different processes.

3. The manufacturing method of the pixel structure according to claim 1, further comprising:
    exposing with a mask, wherein a translucent portion of the mask has a first width and the top surface of the second insulating layer has a second width, and the first width is smaller than the second width.

4. The manufacturing method of the pixel structure according to claim 3, wherein the translucent portion of the mask is located right above the conductive bump.

* * * * *